United States Patent
Byeon et al.

(10) Patent No.: US 7,697,342 B2
(45) Date of Patent: *Apr. 13, 2010

(54) FLASH MEMORY DEVICE AND RELATED HIGH VOLTAGE GENERATING CIRCUIT

(75) Inventors: Dae-Seok Byeon, Yongin-si (KR); Hee-Won Lee, Gwanak-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 336 days.

This patent is subject to a terminal disclaimer.

(21) Appl. No.: 11/797,989

(22) Filed: May 9, 2007

(65) Prior Publication Data

US 2007/0268751 A1   Nov. 22, 2007

(30) Foreign Application Priority Data

May 16, 2006   (KR) ............ 10-2006-0043882

(51) Int. Cl.
*G11C 11/03* (2006.01)

(52) U.S. Cl. .................. 365/185.25; 365/185.05; 365/189.07; 365/189.11; 365/230.08

(58) Field of Classification Search ............ 365/185.25, 365/189.05, 189.07, 230.08, 185.05, 189.11

See application file for complete search history.

(56) References Cited

U.S. PATENT DOCUMENTS

| 6,512,698 | B2 | 1/2003 | Kamei | |
|---|---|---|---|---|
| 7,072,238 | B2 * | 7/2006 | Chae et al. | 365/226 |
| 7,158,418 | B2 * | 1/2007 | Chae et al. | 365/185.23 |
| 7,272,047 | B2 * | 9/2007 | Chae et al. | 365/185.19 |
| 2007/0274133 | A1 * | 11/2007 | Byeon | 365/185.23 |

FOREIGN PATENT DOCUMENTS

| JP | 07249295 | 9/1995 |
|---|---|---|
| JP | 2000-331489 | 11/2000 |
| JP | 2002-008400 | 1/2002 |
| JP | 2005-117773 | 4/2005 |
| KR | 1020050044086 A | 5/2005 |
| KR | 1020050057957 A | 6/2005 |
| KR | 1020060018582 A | 3/2006 |

* cited by examiner

*Primary Examiner*—Pho M. Luu
(74) *Attorney, Agent, or Firm*—Volentine & Whitt, PLLC

(57) ABSTRACT

In a flash memory device, a high voltage generating circuit generates a high voltage and receives the high voltage as a switching voltage for controlling a voltage dividing circuit.

20 Claims, 6 Drawing Sheets

FLASH MEMORY DEVICE AND RELATED HIGH VOLTAGE GENERATING CIRCUIT

BACKGROUND OF THE INVENTION

1. Field of the Invention

Embodiments of the invention relate generally to non-volatile memory devices. More particularly, embodiments of the invention relate to flash memory devices and related high voltage generating circuits.

A claim of priority is made to Korean Patent Application No. 2006-43882 filed on May 16, 2006, the disclosure of which is hereby incorporated by reference.

2. Description of Related Art

Semiconductor memory devices can be roughly divided into volatile memory devices and non-volatile memory devices. In general, volatile memory devices tend to have faster performance than non-volatile memory devices. However, volatile memory devices generally lose stored data when disconnected from an external power source, whereas non-volatile memory devices retain stored data when disconnected from an external power source.

Due to their ability to retain stored data when disconnected from an external power source, non-volatile memory devices are a popular choice for portable electronic devices such as cellular phones, mp3 players, digital cameras, and so on. Examples of non-volatile memory devices include masked read only memory (MROM), programmable read only memory (PROM), erasable and programmable read only memory (EPROM), and electrically erasable and programmable read only memory (EEPROM), to name but a few.

Among non-volatile memory devices, flash memory devices constitute one especially popular form of EEPROM. Flash memory devices are popular, at least in part, due to their relatively high degree of integration, low power consumption, and their ability to withstand physical shock.

In general, flash memory devices can be categorized into different types based on the organization of flash memory cells into different array structures and according to different read/program characteristics. For example, NAND flash memory devices and NOR flash memory devices each have different array structures and different read/program characteristics providing unique tradeoffs and advantages. In particular, NAND flash memory devices tend to have a higher degree of integration, but slower read times, than NOR flash memory devices. Accordingly, NAND flash memory devices are commonly used to provide mass data storage, while NOR flash memory devices are often used to provide storage for data requiring quick access, such as program code.

In NAND flash memory devices, memory cells are typically erased and programmed using Fowler-Nordheim (FN) tunneling. Selected methods for erasing and programming NAND flash memory devices using FN tunneling are disclosed, for example, in U.S. Pat. Nos. 5,473,563 and 5,696,717, entitled "NONVOLATILE SEMICONDUCTOR MEMORY" and "NONVOLATILE INTEGRATED CIRCUIT MEMORY DEVICES HAVING ADJUSTABLE ERASE/PROGRAM THRESHOLD VOLTAGE VERIFICATION CAPABILITY", respectively.

NAND flash memory devices can be programmed using a variety of different programming techniques. One common technique used to program NAND flash memory devices is called an incremental step pulse programming (ISPP) technique. In the ISPP technique, a program voltage is applied to a control gate of one or more selected memory cells in a NAND flash memory device in successive program loops until the respective threshold voltages of the selected memory cells reach desired magnitudes. In each successive program loop, the magnitude of the program voltage is increased in order to raise the threshold voltages of the selected memory cells. Selected embodiments of the ISPP technique are disclosed, for example, in U.S. Pat. No. 5,642,309, entitled "AUTO-PROGRAM CIRCUIT IN A NONVOLATILE SEMICONDUCTOR MEMORY DEVICE".

FIG. 1 is a voltage diagram illustrating a change of a program voltage in a NAND flash memory device during a programming operation using the ISPP technique.

Referring to FIG. 1, the NAND flash memory device receives a program command, a program address, and program data for programming a page of selected memory cells. The program data is loaded into a page buffer circuit and the selected memory cells are identified based on the program address. After the program data is loaded into the page buffer, the program data is simultaneously programmed into the selected memory cells.

In general, the program data is programmed into the selected memory cells using a plurality of program loops each comprising a program period "P" and program verification period "V". In each program period "P", the program voltage is applied to a word line connected to the selected memory cells, and appropriate program bias voltages are applied to respective bit lines connected to the selected memory cells based on the program data.

FIG. 1 illustrates five (5) program loops including program periods "P1" through "P5" each having a duration "t", and corresponding program verification periods "V1" through "V5". During the five program loops, the program voltage is incrementally increased from a magnitude VPGM1 to a magnitude VPGM5. In each successive program loop, the magnitude of the program voltage changes by an increment ΔVPGM.

During each program verification period, the NAND flash memory device performs a verify read operation to determine whether the selected memory cells have reached desired threshold voltages. In the verify read operation, a read verify reference voltage is applied to the word line connected to the selected memory cells and appropriate read bias voltages are applied to respective bit lines connected to the selected memory cells based on the program data. The read verify operation is then able to determine whether the selected memory cells have reached the desired threshold voltages based on the current conduction characteristics of the selected memory cells under these conditions.

In order to successfully program the selected memory cells using the ISPP technique, the NAND flash memory device must be able to accurately control the magnitude of the program voltage. This is especially true when programming memory cells having relatively small read margins, such as multi-level NAND flash memory cells, because where read margins are small, minor fluctuations in the magnitude of the program voltage can produce undesired threshold voltages, or in other words, wrongly programmed memory cells. For example, in the case of programming multi-level NAND flash memory cells, the duration of each program period "P" may be relatively small, and the magnitude of the program voltage may be relatively large compared with the increment ΔVPGM. Accordingly, absent accurate control of the program voltage, undesired variations in the timing and magnitude of the program voltage may exceed acceptable margins for increment ΔVPGM and duration "t".

For at least the above reasons, it is desirable to develop reliable, accurate, and stable ways of producing a high voltages in semiconductor devices.

SUMMARY OF THE INVENTION

According to one embodiment of the invention, a high voltage generating circuit comprises a charge pump, a voltage dividing circuit, a comparing circuit, and a clock controlling circuit. The charge pump is adapted to generate a high voltage in response to a pumping clock signal. The voltage dividing circuit is adapted to receive the high voltage as a switching voltage to selectively activate a plurality of voltage dividing paths, and further adapted to divide the high voltage in a resulting activated voltage dividing path to produce a divided voltage result. The comparing circuit is adapted to compare the divided voltage result with a reference voltage to generate a compare signal. The clock controlling circuit is adapted to generate the pumping clock signal according to the compare signal.

According to another embodiment of the invention, a flash memory device comprises a memory cell array, a high voltage generating circuit, add a controller. The memory cell array comprises a plurality of memory cells arranged in a matrix comprising a plurality of word lines and bit lines. The high voltage generating circuit is adapted to generate a high voltage to be applied to a selected word line among the plurality of word lines. The controller is adapted to generate a plurality of enable signals for controlling generation of the high voltage. The high voltage generating circuit receives the high voltage as a switching voltage, and controls a magnitude of the high voltage in response to the switching voltage and the plurality of enable signals.

BRIEF DESCRIPTION OF THE FIGURES

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

According to selected embodiments of the invention, a high voltage generating circuit generates a high voltage and provides the high voltage to a flash memory device. In the high voltage generating circuit, the high voltage is fed-back and used as a switching voltage. The magnitude of the high voltage is adjusted in response to the switching voltage and a plurality of enable signals generated by the switching voltage and a controller.

The switching voltage and enable voltages are maintain the same magnitude throughout each program loop of a program operation. Accordingly, the switching voltage maintains a predetermined magnitude during each of the program loop, and thus a voltage dividing path used to generate the high voltage is stably and accurately controlled. Consequently, unnecessary pumping operations are avoided, and an overshooting phenomenon is prevented.

Figure 1:
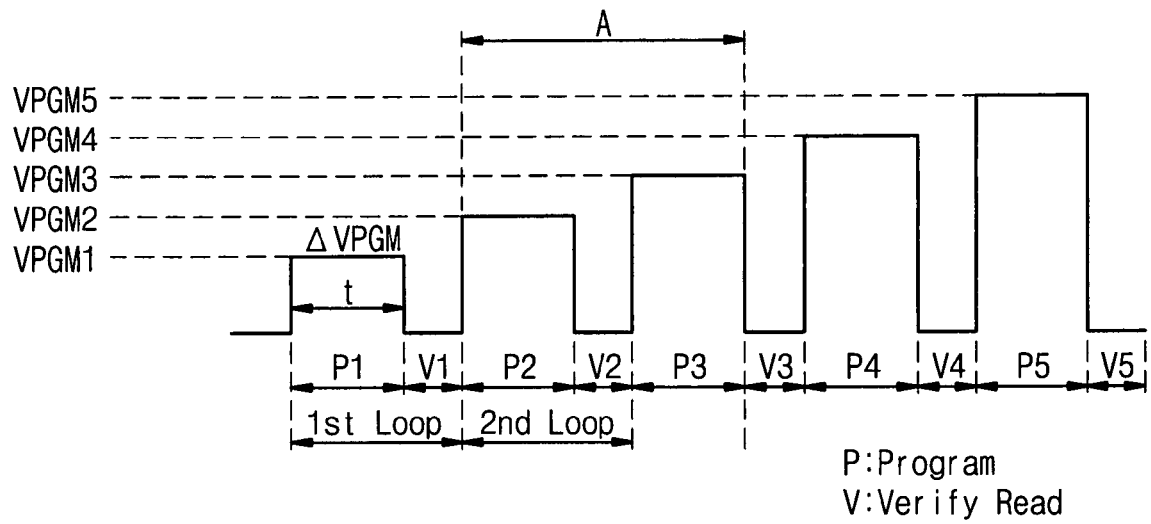
FIG. 1 is a waveform timing diagram illustrating a program voltage during a program operation of a NAND flash memory device using an ISPP technique.
Figure 2:
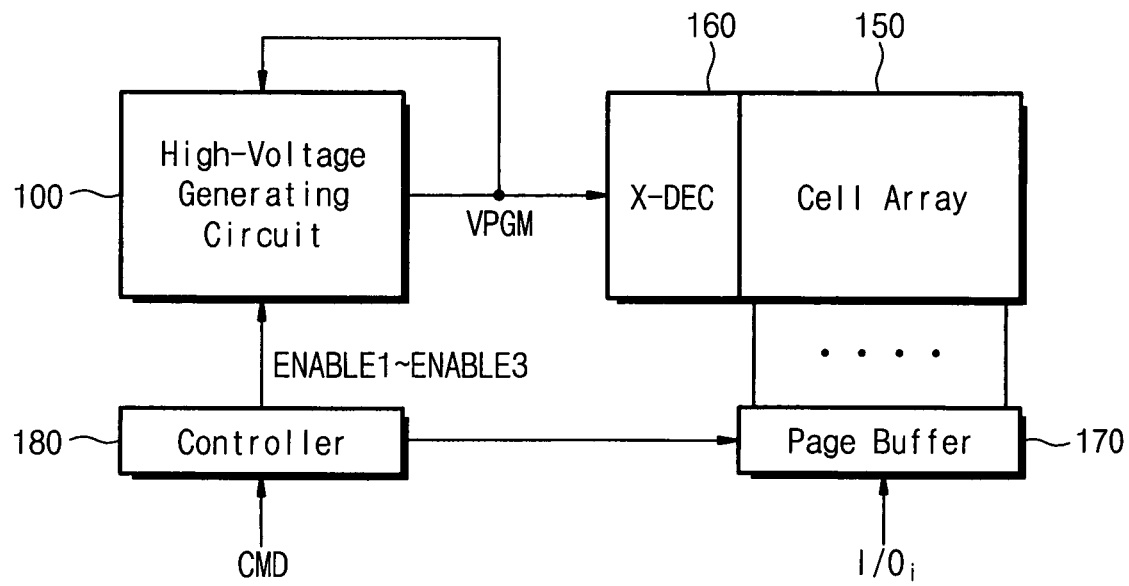
FIG. 2 is a block diagram of a flash memory device according to one embodiment of the invention.

FIG. 2 is a block diagram illustrating a flash memory device according to one embodiment of the invention. For explanation purposes, it will be assumed that the flash memory device is a NAND flash memory device.

Referring to FIG. 2, the flash memory device comprises a high voltage generating circuit 100, a memory cell array 150, a row decoding circuit 160, a page buffer circuit 170, and a controller 180.

Memory cell array 150 comprises a plurality of memory blocks. Each of the memory blocks comprises a plurality of NAND strings each comprising a string select transistor, a ground select transistor, and a plurality of floating gate transistors functioning as memory cells. Channels of the floating gate transistors are connected in series between the string select transistor and the ground select transistor.

Memory cell array 150 is organized into a matrix comprising a plurality of word lines corresponding to rows of the matrix, and a plurality of bit lines corresponding to columns of the matrix. Each word line is connected to control gates of a corresponding page of floating gate transistors among the plurality of floating gate transistors. In addition, each bit line is connected to a corresponding one of the NAND strings.

Row decoding circuit 160 drives the rows of memory cell array 150 and page buffer circuit 170 drives the columns of memory cell array 150. Row decoding circuit 160 selects one of the plurality of word lines based on a row address. Word line voltages are then applied to the selected word line and to unselected word lines based on an operation mode of the flash memory device. For example, during a program operation mode, row decoding circuit 160 supplies a program voltage VPGM to the selected word line, and one of a pass voltage and a decoupling voltage to unselected word lines. On the other hand, during a read operation mode, row decoding circuit 160 supplies a ground voltage GND to the selected word line and a read voltage to unselected word lines.

Bit lines arranged in memory cell array 150 are electrically connected to page buffer circuit 170. Page buffer circuit 170 typically comprises a page buffer corresponding to each bit line. In general, each page buffer may be connected to a pair of bit lines. Page buffer circuit 170 is controlled by controller 180. Each page buffer in page buffer circuit 170 can serve as a sense amplifier or a write driver according to the operation mode of the flash memory device. For example, during the program operation mode, page buffer circuit 170 may supply a power voltage (or, a program-inhibit voltage) or a ground voltage (or, a program voltage) to the bit lines according to the program data. On the other hand, during a read or read verify operation mode, page buffer circuit 170 may detect data stored in the selected memory cells through the bit lines.

Controller 180 exercises control over the operation of the flash memory device. Controller 180 generates a plurality of enable signals ENABLE1 through ENABLE3 to generate a program voltage VPGM in response to a program command CMD received via input/output pins.

High voltage generating circuit 100 generates a high voltage (e.g., program voltage VPGM, the pass voltage, the decoupling voltage, or the read voltage) with a magnitude greater than a power voltage in response to enable signals ENABLE1 to ENABLE3 generated by controller 180. The structure of high voltage generating circuit 100 is described in further detail below. In the description that follows, high voltage generating circuit 100 is described as producing program voltage VPGM. However, it should be understood that high voltage generating circuit 100 could also be used to generate other voltages such as the pass voltage, the decoupling voltage, or the read voltage.

First enable signal ENABLE1 generated by controller 180 is adapted to activate high voltage generating circuit 100. Second and third enable signals ENABLE2 and ENABLE3 are adapted to adjust a magnitude of program voltage VPGM for successive program loops. High voltage generating circuit 100 selectively outputs switching voltage VSWITCH according to an activation state of second and third enable signals ENABLE2 and ENABLE3.

Switching voltage VSWITCH controls a voltage dividing path of program voltage VPGM located within high voltage generating circuit 100. As the voltage dividing path is controlled, a magnitude of program voltage VPGM generated by high voltage generating circuit 100 is adjusted.

High voltage generating circuit 100 receives a fed-back version of program voltage VPGM as switching voltage VSWITCH. Accordingly, high voltage generating circuit 100 does not require an additional circuit component for generating switching voltage VSWITCH.

The magnitude of switching voltage VSWITCH is controlled to stably generate program voltage VPGM. Where the magnitude of switching voltage VSWITCH is not sufficiently high, control of the voltage dividing path may become inaccurate, and program voltage VPGM may be generated with an unstable magnitude.

Because high voltage generating circuit 100 uses program voltage VPGM as switching voltage VSWITCH, the magnitude of switching voltage VSWITCH can reach the magnitude of program voltage VPGM, thereby stably controlling the voltage dividing path. As a result, leakage current does not flow through the voltage dividing path, and therefore program voltage VPGM is generated with a stable magnitude.

Figure 3:
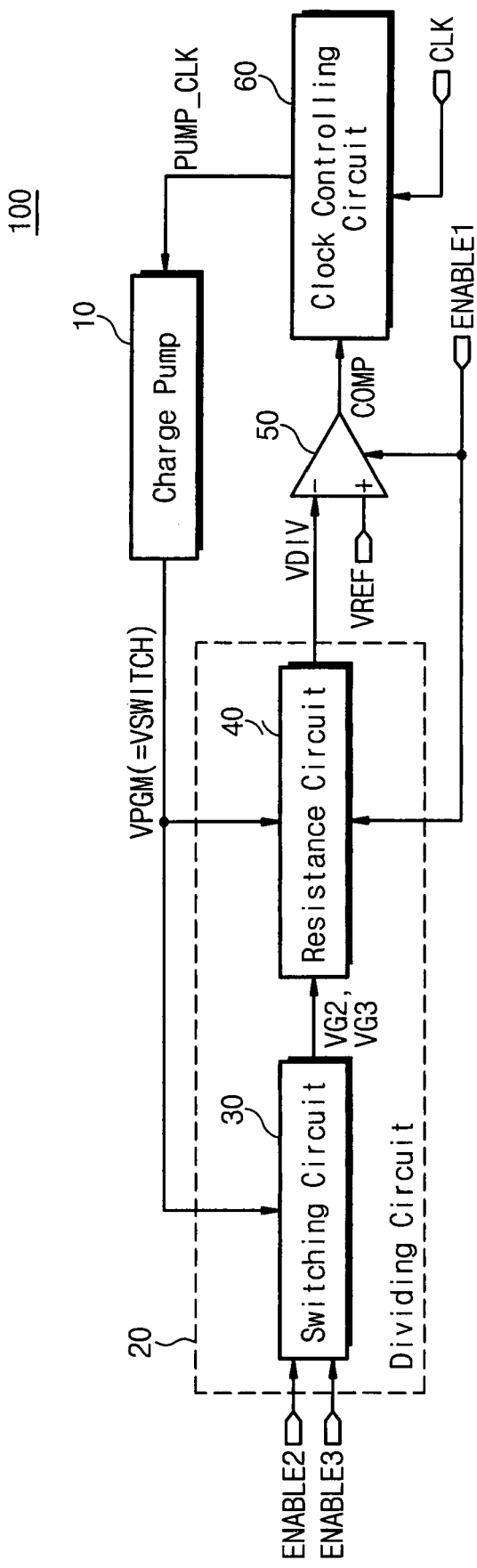
FIG. 3 is a block diagram of a high voltage generating circuit illustrated in FIG. 2 according to an embodiment of the invention.
Figure 4:
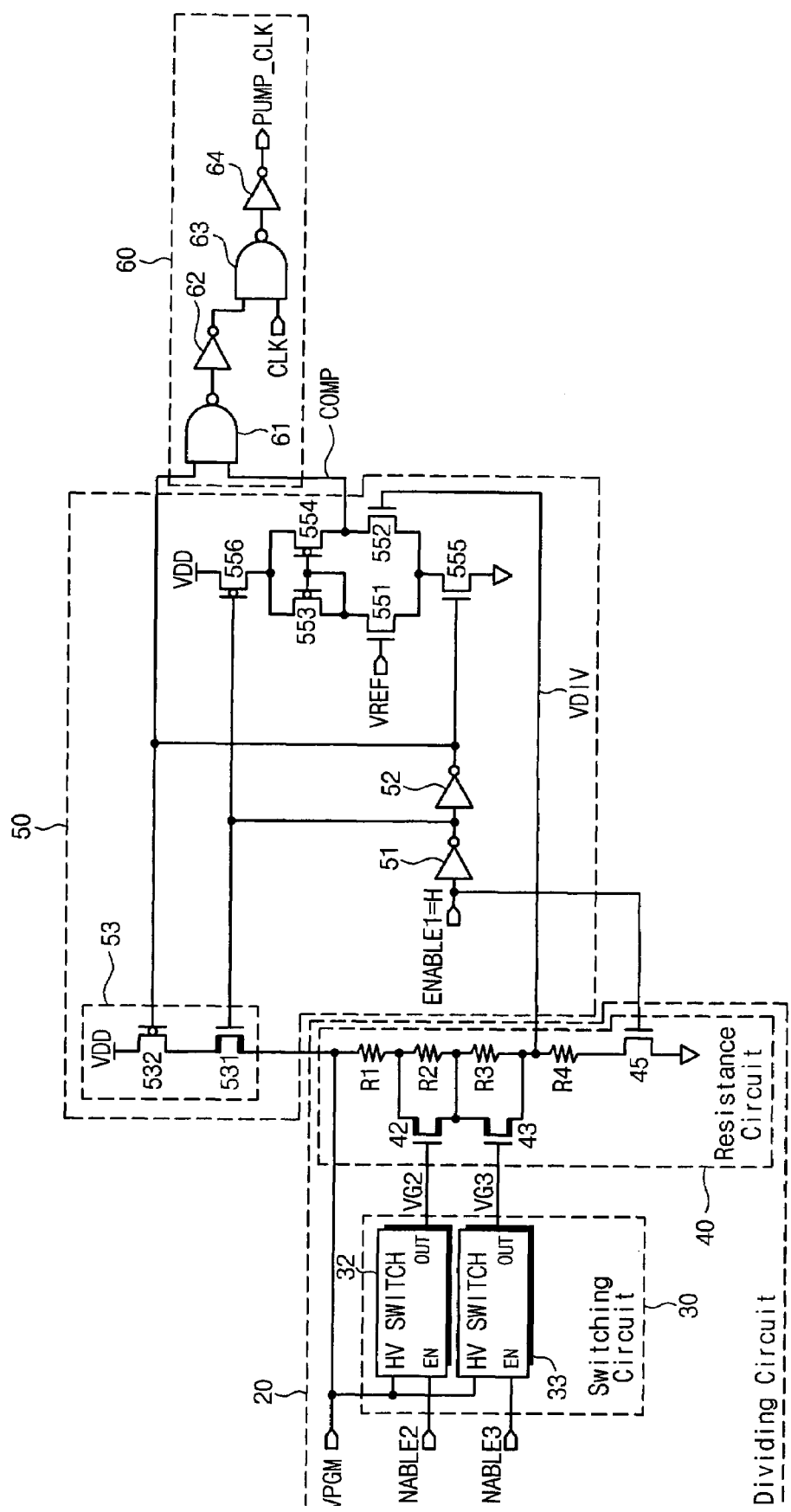
FIG. 4 is a circuit diagram of the high voltage generating circuit illustrated in FIG. 2 according to an embodiment of the invention.

FIG. 3 is a block diagram of high voltage generating circuit 100 according to an embodiment of the invention and FIG. 4 is a circuit diagram of high voltage generating circuit 100 according to an embodiment of the invention.

Referring to FIGS. 3 and 4, high voltage generating circuit 100 comprises a charge pump 10, a voltage dividing circuit 20, a comparing circuit 50, and a clock controlling circuit 60.

Charge pump 10 generates program voltage VPGM in response to a pumping clock signal PUMP_CLK generated by clock controlling circuit 60. Although only one charge pump 10 is illustrated in FIGS. 3 and 4, a plurality of pumping circuits may be included in high voltage generating circuit 100. Such additional pumping circuits could be used, for example, to generate voltages for different operations of the flash memory device, such as the pass voltage, the decoupling voltage, or the read voltage.

Voltage dividing circuit 20 is activated in response to first enable signal ENABLE1 generated by controller 180. Voltage dividing circuit 20 determines a voltage dividing path in response to program voltage VPGM generated by charge pump 10 and second and third enable signals ENABLE 2 and ENABLE 3 generated by controller 180. Voltage dividing circuit 20 divides program voltage VPGM through the determined voltage dividing path. A total resistance value of voltage dividing circuit 20 is determined according to the determined voltage dividing path. To control the determination of the voltage dividing path, voltage dividing circuit 20 comprises a switching circuit 30 and a resistance circuit 40.

Switching circuit 30 comprises a plurality of high voltage switches 32 and 33. Each of high voltage switches 32 and 33 receives program voltage VPGM generated by charge pump 10 as switching voltage VSWITCH. High voltage switches 32 and 33 selectively output switching voltage VSWITCH (i.e., the program voltage VPGM) in response to second and third enable signals ENABLE 2 and ENABLE 3.

Switching voltages selectively output from high voltage switches 32 and 33 are called gate controlling voltages VG2 and VG3. Gate controlling voltages VG2 and VG3 generated by high voltage switches 32 and 33 are input to resistance circuit 40.

Second and third enable signals ENABLE2 and ENABLE3 are used to adjust the magnitude of program voltage VPGM in successive program loops. Since program voltage VPGM increases with each successive program loop, switching voltage VSWITCH also increases with each successive program loop, and gate controlling voltages VG2 and VG3 generated by switching circuit 30 are modified accordingly.

Resistance circuit 40 comprises a plurality of resistances R1 through R4 for dividing program voltage VPGM generated from charge pump 10. Resistances R1 through R4 are connected in series. Resistance R1 receives program voltage VPGM from charge pump 10. Resistance R4 is connected to ground through a discharging transistor 45. Discharging transistor 45 is turned on by first enable signal ENABLE1 to activate a discharging path of resistance circuit 40 (i.e., a discharging path between resistances R1 through R4). As the discharging path of resistance circuit 40 is activated, a voltage dividing operation of resistance circuit 40 is activated.

A plurality of switching transistors are connected in parallel to resistances R2 and R3. Gate controlling voltages VG2 and VG3 generated from switching circuit 30 are applied to gate terminals of switching transistors 42 and 43. Switching transistors 42 and 43 are turned on/off in response to gate controlling voltages VG2 and VG3. According to the turn-on/off of the switching transistors 42 and 43, a current is cut off from/provided to corresponding resistances R2 and R3. That is, according to the turn-on/off of switching transistors 42 and 43, a voltage dividing path of resistance circuit 40 is changed, and a total resistance value for dividing program voltage VPGM is changed. At this point, the magnitude of program voltage VPGM is higher than that of a power voltage VDD used to power the flash memory device. Accordingly, switching transistors 42 and 43 typically comprise high voltage transistors.

The alteration of the voltage dividing path according to the turn-on/off of the switching transistors 42 and 43 is described below in further detail. For example, where enable signal ENABLE2 is activated (e.g., assumes a logic level "high") and enable signal ENABLE3 is deactivated (e.g., assumes logic level "low"), control voltage VG2 assumes logic level "high" and gate controlling voltage VG3 assumes logic level "low". In this case, switching transistor 42 is turned on and switching transistor 43 is turned off. Consequently, the voltage dividing path of resistance R2 is deactivated and the voltage dividing path of the resistance R3 is activated. Therefore, program voltage VPGM is divided by resistance R1, R3, and R4. The divided voltage result VDIV is $$VDIV = \frac{R4}{R1 + R3 + R4} VPGM.$$

For example, where enable signals ENABLE2 and ENABLE3 have logic level "high" and gate controlling voltages VG2 and VG3 have logic level "high", switching transistors 42 and 43 are turned on. Consequently, the voltage dividing paths of resistances R2 and R3 are deactivated. At this point, program voltage VPGM is divided by resistances R1 and R4. Accordingly, divided voltage result VDIV is $$VDIV = \frac{R4}{R1 + R4} VPGM.$$

Where switching transistors 42 and 43 are fully turned on by gate controlling voltages VG2 and VG3, program voltage VPGM, typically having a magnitude of about 20 V, is apparent at both drain and source regions of switching transistors 42 and 43. However, where gate controlling voltages VG2 and VG3 fall below the magnitude of program voltage VPGM, switching transistors 42 and 43 may only be partially turned on. As a result, some current may flow through resistances R2 and R3 rather than through switching transistors 42 and 43.

Where current flows through resistances R2 and R3 rather than through switching transistors 42 and 43, a total resistance value for divided voltage result VDIV changes, or becomes inaccurate. To address this problem, program voltage VPGM generated from high voltage generating circuit 100 is input as switching voltage VSWITCH, and gate controlling voltages VG2 and VG3 are generated using switching voltage VSWITCH. As a result, gate controlling voltages VG2 and VG3 maintain a level equal to program voltage VPGM.

Comparing circuit 50 compares divided voltage result VDIV generated by voltage dividing circuit 20 with a reference voltage VREF to generate a compare signal COMP. Comparing circuit 50 comprises a differential amplifying circuit for comparing divided voltage result VDIV with reference voltage VREF.

Comparing circuit 50 comprises a first transistor 551 having a gate terminal receiving reference voltage VREF, a second transistor 552 having a gate terminal receiving a divided voltage result VDIV, and a discharging transistor 555 connected to respective source terminals of first and second transistors 551 and 552. Although not illustrated, reference voltage VREF is typically generated by dividing a voltage such as power voltage VDD. First and second transistors 551 and 552 and discharging transistors 555 comprise negative metal-oxide semiconductor (NMOS) transistors.

First enable signal ENABLE1 is applied to a gate of discharging transistor 555. A drain terminal of discharging transistor 555 is connected to the respective source terminals of first and second transistors 551 and 552, and the source terminal of discharging transistor 555 is connected to ground. Discharging transistor 555 discharges current provided from first and second transistors 551 and 552 in response to first enable signal ENABLE1 applied to the gate. Third and fourth transistors 553 and 554 are connected to respective drain terminals of first and second transistors 551 and 552. Third and fourth transistors 553 and 554 comprise positive metal-oxide semiconductor (PMOS) transistors. A sixth transistor 556 has a drain connected to respective source terminals of third and fourth transistors 553 and 554 and a source connected to power voltage VDD.

Comparing circuit 50 further comprises first and second inverters 51 and 52 and a power voltage controlling unit 53. First inverter 51 inverts first enable signal ENABLE1 and second inverter inverts an output of first inverter 51. Power voltage controlling unit 53 comprises first and second power voltage controlling transistors 531 and 532 connected in series between power voltage VDD and resistance circuit 40. Respective outputs of first and second inverters 51 and 52 are applied to gate terminals of first and second power voltage controlling transistors 531 and 532. First and second power voltage controlling transistors 531 and 532 are turned off in response to an activation of first enable signal ENABLE1, thereby preventing program voltage VPGM from being directly applied to comparing circuit 50 and clock controlling circuit 60. Consequently, damage to low voltage circuits in comparing circuit 50 and clock controlling circuit 60 is prevented.

Where first enable signal ENABLE1 is activated, comparing circuit 50 operates as follows. First and second transistors 551 and 552 receive reference voltage VREF and divided voltage result VDIV, respectively. The current driving ability of first and second transistors 551 and 552 varies according to the magnitude of reference voltage VREF and divided voltage result VDIV, respectively. Current flowing through first and second transistors 551 and 552 is discharged through discharging transistor 555.

For example, where the magnitude of divided voltage result VDIV is lower than the magnitude of reference voltage VREF, the current driving ability of second transistor 552 is less than that of first transistor 551. Accordingly, second transistor 552 will tend to discharge a small amount of current through discharging transistor 555 compared with first transistor 551. As a result, a drain voltage of first transistor 551 will tend to become lower than a drain voltage of second transistor 552. The relatively low drain voltage of first transistor 551 is applied to respective gate terminals of third and fourth transistors 553 and 554 to increase respective amounts of current flowing through third and fourth transistors 553 and 554. Consequently, the drain voltage of second transistor 552 increases and a compare signal COMP is generated with logic level "high".

On the other hand, where the magnitude of divided voltage result VDIV is greater than the magnitude of reference voltage VREF, the current driving ability of second transistor 552 is greater than that of first transistor 551. Accordingly, second transistor 552 tends to discharge a large amount of current through discharging transistor 555 compared with first transistor 551. As a result, the drain voltage of first transistor 551 will tend to become higher than the drain voltage of second transistor 552. The relatively higher drain voltage of first transistor 551 is applied to respective gate terminals of third and fourth transistors 553 and 554 to reduce the current driving ability of third and fourth transistors 553 and 554. Consequently, the drain voltage of second transistor 552 decreases and compare signal COMP is generated with logic level "low".

Clock controlling circuit 60 generates a pumping clock signal PUMP_CLF in response to compare signal COMP and a clock signal CLK. For example, clock controlling circuit 60 generates pumping clock signal PUMP_CLK with logic level "high" where divided voltage result VDIV has a lower magnitude than reference voltage VREF.

Clock controlling circuit 60 comprises a plurality of logic gates 61 through 64 to generate pumping clock signal PUMP_CLK. Clock controlling signal 60 receives first enable signal ENABLE1 through second inverter 52 of comparing circuit 50. Clock controlling circuit 60 generates pumping clock signal PUMP_CLK with a period equal to clock signal CLK input into logic gate 63 when first enable signal ENABLE1 is activated and divided voltage result VDIV has a lower magnitude than reference voltage VREF. Charge pump 10 performs a charge pumping operation during a period while pumping clock signal PUMP_CLK has logic level "high".

On the other hand, clock controlling circuit 60 deactivates pumping clock signal PUMP_CLK where first enable signal ENABLE1 is activated and the magnitude of divided voltage result VDIV is greater than reference voltage VREF (i.e., compare signal COMP is generated with logic level "low"). Pumping clock signal PUMP_CLK is deactivated where first enable signal ENABLE1 is deactivated. The structure of logic gates 61 through 64 constituting the clock controlling circuit 60 of FIG. 4 may have various forms.

As described above, divided voltage result VDIV is used to activate a pumping operation of charge pump 10. The magnitude of divided voltage result VDIV is related to voltage dividing paths through resistances R2 and R3. Divided voltage result VDIV is also related to gate controlling voltages VG2 and VG3 applied to respective gates of switching transistors 42 and 43. Here, the levels of gate controlling voltages VG2 and VG3 are actually determined by the level of switching voltage VSWITCH. Switching voltage VSWITCH maintains a sufficiently high level to turn on switching transistors 42 and 43.

Embodiments of the invention use program voltage VPGM as switching voltage VSWITCH, to maintain the switching voltage VSWITCH. Where switching voltage VSWITCH does not have a sufficient magnitude, switching transistors 42 and 43 are not fully turned on and an overshoot may occur in program voltage VPGM. The operation of gate controlling voltages VG2 and VG3 and program voltage VPGM according to the magnitude of switching voltage VSWITCH is described in further detail below.

Figure 5:
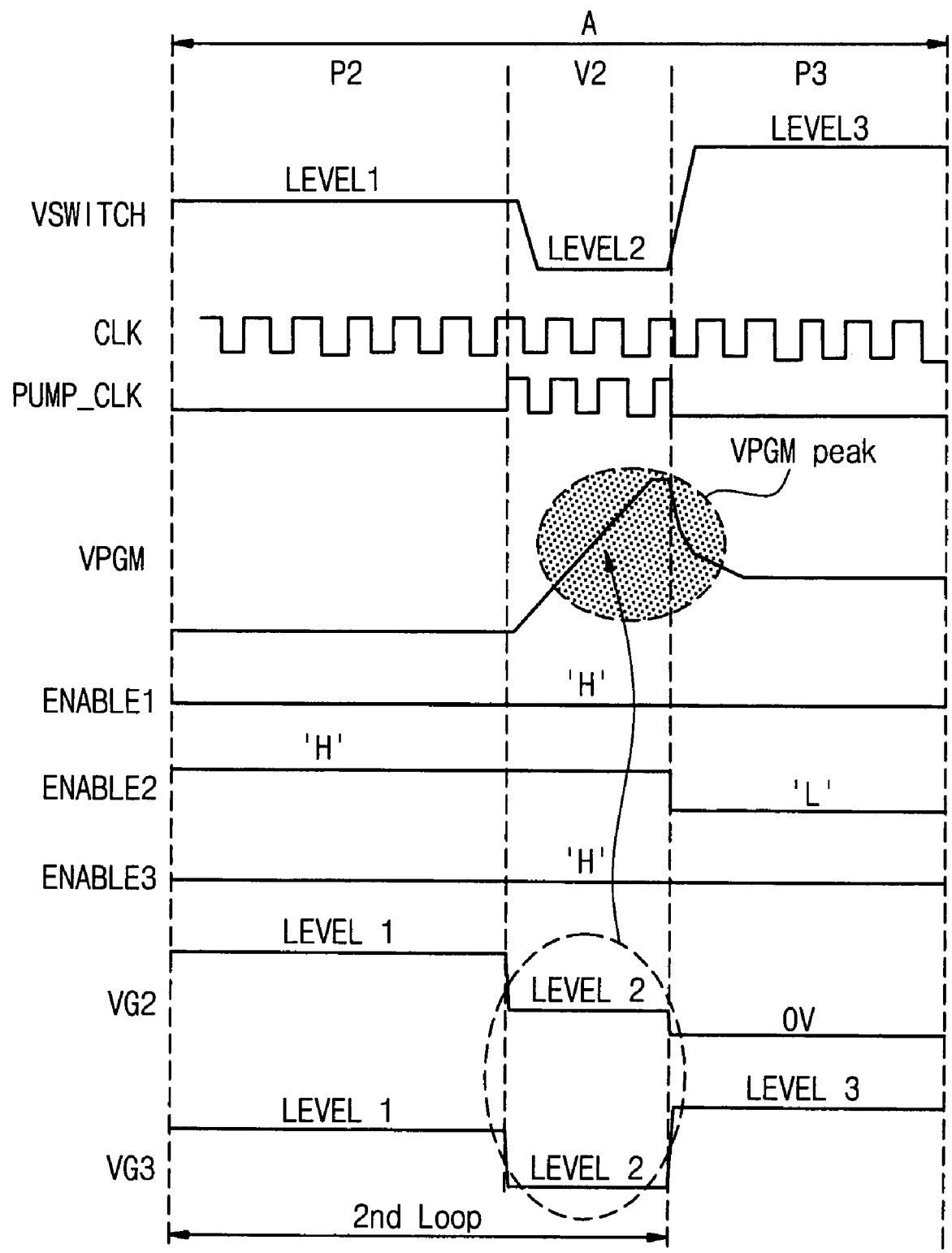
FIG. 5 is a waveform timing diagram illustrating a program voltage VPGM when a switching voltage VSWITCH and gate controlling voltages VG2 and VG3 have insufficient magnitudes to turn on a switching transistor.
Figure 6:
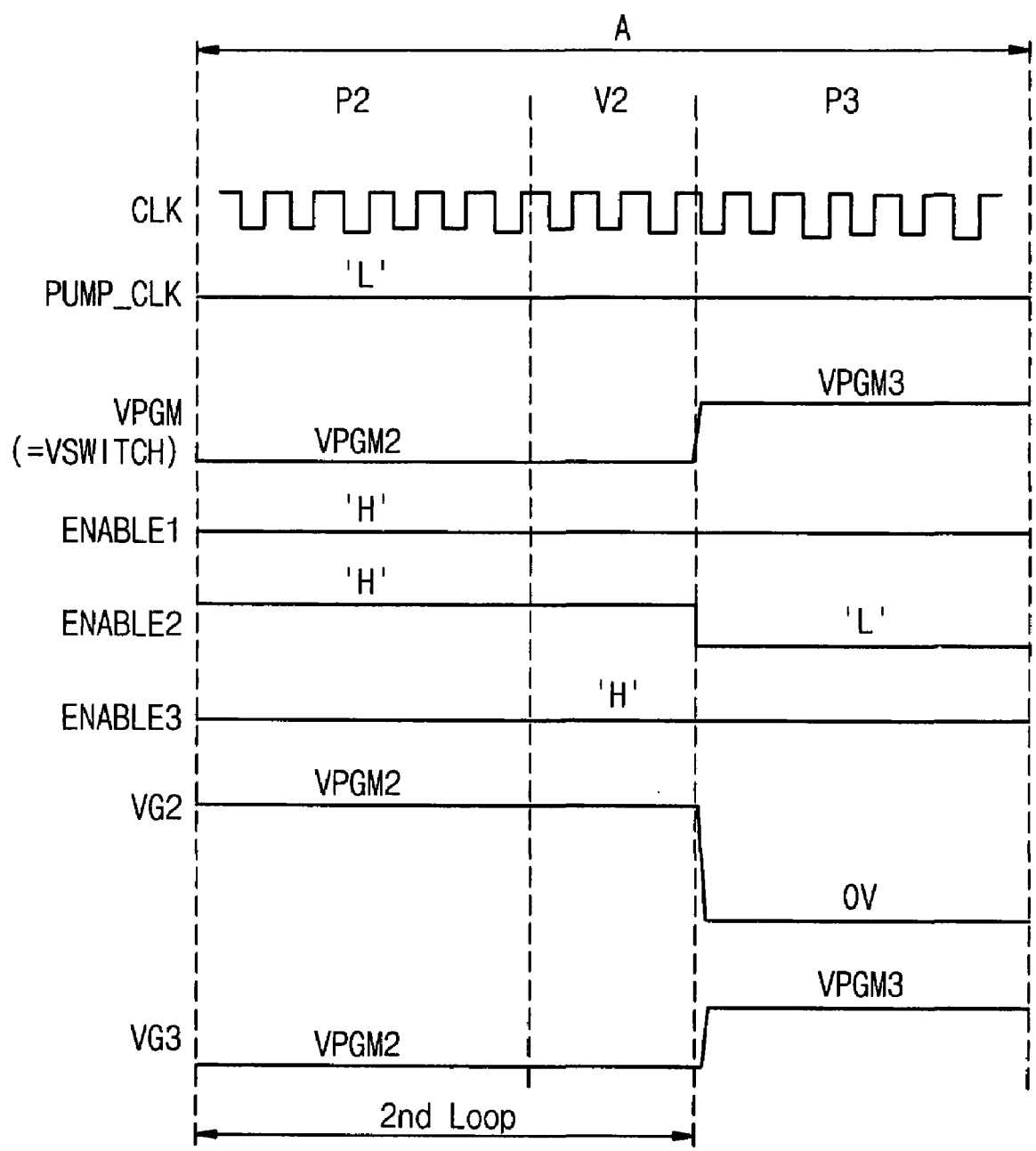
FIG. 6 is a waveform timing diagram illustrating the operation of a high voltage generating circuit according to an embodiment of the invention.

FIG. 5 is a waveform timing diagram illustrating a change of program voltage VPGM when switching voltage VSWITCH and gate controlling voltages VG2 and VG3 have insufficient magnitudes for turning on switching transistors 42 and 43. FIG. 6 is a waveform timing diagram of high voltage generating circuit 100 according to an embodiment of the invention. As Switching voltage VSWITCH and gate controlling voltages VG2 and VG3 can efficiently prevent overshooting of program voltage VPGM.

FIG. 5 illustrates an example where program voltage VPGM is different from switching voltage VSWITCH. Where program voltage VPGM is different from switching voltage VSWITCH, program voltage VPGM and switching voltage VSWITCH are typically generated by different respective pump circuits.

However, FIG. 6 illustrates an operation of high voltage generating circuit 100 where program voltage VPGM and switching voltage VSWITCH are identical. More particularly, in FIG. 6, it is assumed that high voltage generating circuit 100 receives a fed-back version of program voltage VPGM as switching voltage VSWITCH.

In FIG. 5, switching voltage VSWITCH has a magnitude that increases with successive program loops. For example, in FIG. 5, switching voltage VSWITCH has magnitudes LEVEL1 and LEVEL3 greater than or equal to program voltage VPGM during respective program periods P2 and P3 when program voltage VPGM is applied to memory cell array 150. Accordingly, gate controlling voltages VG2 and VG3 also have magnitudes LEVEL1 and LEVEL3 greater than or equal to program voltage VPGM during respective program periods P2 and P3. However, switching voltage VSWITCH decreases to a magnitude LEVEL2 corresponding to a read voltage VREAD during a program verification period V2 of where program voltage VPGM is not applied to memory cell array 150. The reason why switching voltage VSWITCH decreases to magnitude LEVEL2 during program verification period V2 is that program voltage VPGM is deactivated during program verification period V2 and read voltage VREAD is activated to be applied to the selected word line.

Where the level of switching voltage VSWITCH falls based on a magnitude of a voltage applied to the selected word line, the respective magnitudes of gate controlling voltages VG2 and VG3 decrease. Accordingly, switching transistors 42 and 43 may not be properly turned on. Accordingly, a leakage current may flow through resistances R2 and R3 corresponding to switching transistors 42 and 43. Due to the leakage current, divided voltage result VDIV decreases. Consequently, the decreased divided voltage result VDIV activates pumping clock signal PUMP_CLK. Charge pump 10 performs a pumping operation in response to pumping clock signal PUMP_CLK generated during program verification period V2. As a result, program voltage VPGM increases dramatically during program verification period V2 such that overshooting occurs. Due to the overshooting, additional time is required to stabilize program voltage VPGM before program period P3 begins.

In addition to requiring extra time to stabilize program voltage VPGM, the overshooting problem also increases power consumption due to the pumping operation of charge pump 10. Unfortunately, both of these factors have negative effects on the performance of the flash memory device.

To address the overshooting problem, high voltage generating circuit 100 uses program voltage VPGM as switching voltage VSWITCH. Program voltage VPGM is adjusted in successive program loops, and therefore switching voltage VSWITCH and gate controlling voltages VG2 and VG3 are also shifted in successive program loops. As a result, unnecessary pumping operations are eliminated.

Figure 7:
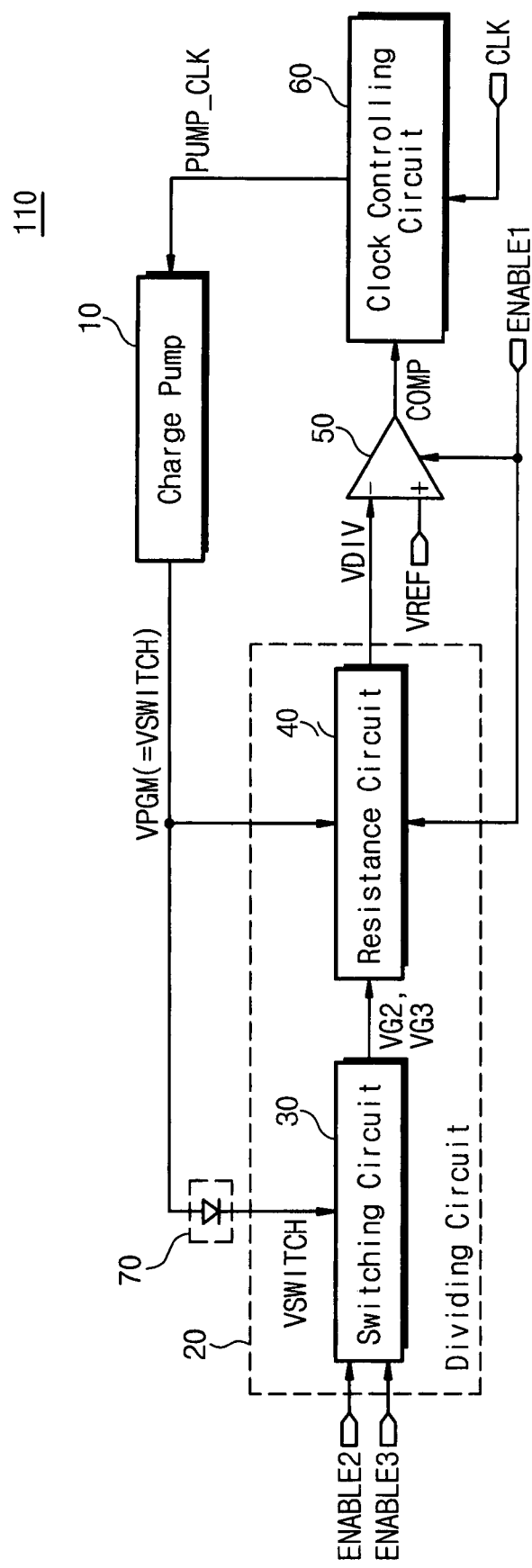
FIG. 7 is a block diagram of a high voltage generating circuit according to another embodiment of the invention.

FIG. 7 is a block diagram illustrating a high voltage generating circuit 110 according to another embodiment of the invention. Referring to FIG. 7, high voltage generating circuit 110 is substantially the same as high voltage generating circuit 100 shown in FIG. 3, except for a rectifying circuit 70 connected between charge pump 10 and switching circuit 30. Additional explanation of the previously described features will be omitted to avoid redundancy.

Referring to FIGS. 3 and 7, program voltages generated by high voltage generating circuits 100 and 10 can be directly used as switching voltage VSWITCH, or can be used as switching voltage VSWITCH after fluctuations program voltage VPGM are removed by rectifying circuit 70. Rectifying circuit 70 typically comprises a rectifying device such as a diode or use a low pass filter (LPF) adapted to remove high frequency noise. However, rectifying circuit 70 could take on a variety of other forms.

Although high voltage generating circuit 100 is described above as generating program voltage VPGM, high voltage generating circuit 100 could be used to generate a variety of different voltages such as a pass voltage, a decoupling voltage, or a read voltage.

In conclusion, selected embodiments of the invention described above are adapted to prevent undesired fluctuations such as overshooting in high voltages generated by a high voltage generating circuit. Accordingly, selected embodiments of the invention are adapted to stably generate high voltages.

The foregoing exemplary embodiments are teaching examples. Those of ordinary skill in the art will understand that various changes in form and details may be made to the exemplary embodiments without departing from the scope of the invention as defined by the following claims.

What is claimed:

1. A high voltage generating circuit, comprising:
   a charge pump adapted to generate a high voltage in response to a pumping clock signal;
   a voltage dividing circuit adapted to receive the high voltage as a switching voltage to selectively activate a plurality of voltage dividing paths, and further adapted to divide the high voltage in a resulting activated voltage dividing path to produce a divided voltage result;
   a comparing circuit adapted to compare the divided voltage result with a reference voltage to generate a compare signal; and
   a clock controlling circuit adapted to generate the pumping clock signal according to the compare signal.

2. The high voltage generating circuit of claim 1, wherein the switching voltage is maintained at a substantially constant magnitude throughout each program loop of a program operation, wherein each program loop comprises a first period and a second period; and
   wherein the high voltage is activated during the first period and deactivated during the second period.

3. The high voltage generating circuit of claim 1, wherein the high voltage is one of a program voltage, a pass voltage, a decoupling voltage, and a read voltage.

4. The high voltage generating circuit of claim 1, further comprising:
   a rectifying circuit connected between the charge pump and the voltage dividing circuit to remove voltage fluctuations from the high voltage.

5. The high voltage generating circuit of claim 1, wherein the voltage dividing circuit comprises:
   a switching circuit adapted to generate a plurality of gate controlling voltages in response to the switching voltage and a plurality of enable signals; and
   a resistance circuit adapted to selectively activate the plurality of voltage dividing paths in response to the plurality of gate controlling voltages and further adapted to divide the high voltage through the activated voltage dividing path.

6. The high voltage generating circuit of claim 5, wherein the enable signals are maintained at a substantially constant magnitude during each program loop of a program operation.

7. The high voltage generating circuit of claim 5, wherein the resistance circuit comprises:
   a plurality of resistances connected in series between the a first terminal connected to the high voltage and a second terminal connected to ground; and
   a plurality of switching transistors connected in parallel to the plurality of resistances, wherein the plurality of switches are respectively controlled by the plurality of gate controlling voltages.

8. The high voltage generating circuit of claim 7, wherein each of the switching transistors switches a voltage dividing path of a corresponding resistance in response to a corresponding one of the plurality of gate controlling voltages.

9. The high voltage generating circuit of claim 7, wherein each of the switching transistors comprises a high voltage transistor.

10. The high voltage generating circuit of claim 5, wherein the switching circuit comprises a plurality of high voltage switches.

11. A flash memory device, comprising:
    a memory cell array comprising a plurality of memory cells arranged in a matrix comprising a plurality of word lines and bit lines;
    a high voltage generating circuit adapted to generate a high voltage to be applied to a selected word line among the plurality of word lines; and
    a controller adapted to generate a plurality of enable signals for controlling generation of the high voltage;
    wherein the high voltage generating circuit receives the high voltage as a switching voltage, and controls a magnitude of the high voltage in response to the switching voltage and the plurality of enable signals.

12. The flash memory device of claim 11, wherein the enable signals and the switching voltage maintain substantially constant magnitudes during each program loop of a program operation, wherein each program loop comprises a first period and a second period; and
    wherein the high voltage is applied to the selected word line during the first period and is not applied to the selected word line during the second period.

13. The flash memory device of claim 11, wherein the high voltage generating circuit comprises:
    a charge pump adapted to generate the high voltage in response to a pumping clock signal;
    a voltage dividing circuit adapted to receive the high voltage as the switching voltage to selectively activate a plurality of voltage dividing paths, and further adapted to divide the high voltage in a resulting activated voltage dividing path to produce a divided voltage result;
    a comparing circuit adapted to compare the divided voltage result with a reference voltage to generate a compare signal; and
    a clock controlling circuit adapted to generate the pumping clock signal according to the compare signal.

14. The flash memory device of claim 13, further comprising:
    a rectifying circuit connected between the charge pump and the voltage dividing circuit to remove voltage fluctuations from the high voltage.

15. The flash memory device of claim 13, wherein the voltage dividing circuit comprises:
    a switching circuit adapted to generate a plurality of gate controlling voltages in response to the switching voltage and a plurality of enable signals; and
    a resistance circuit adapted to selectively activate the plurality of voltage dividing paths in response to the plurality of gate controlling voltages and further adapted to divide the high voltage through the activated voltage dividing path.

16. The flash memory device of claim 15, wherein the resistance circuit comprises:
    a plurality of resistances connected in series between the a first terminal connected to the high voltage and a second terminal connected to ground; and
    a plurality of switching transistors connected in parallel to the plurality of resistances, wherein the plurality of switches are respectively controlled by the plurality of gate controlling voltages.

17. The flash memory device of claim 16, wherein each of the switching transistors switches a voltage dividing path of a corresponding resistance in response to a corresponding one of the plurality of gate controlling voltages.

18. The flash memory device of claim 16, wherein each of the switching transistors comprises a high voltage transistor.

19. The flash memory device of claim 15, wherein the switching circuit comprises a plurality of high voltage switches.

20. The flash memory device of claim 11, wherein the high voltage is one of a program voltage, a pass voltage, a decoupling voltage, and a read voltage.

* * * * *